(12) United States Patent
Raghunathan et al.

(10) Patent No.: US 10,672,701 B2
(45) Date of Patent: Jun. 2, 2020

(54) THIN ELECTRONIC PACKAGE ELEMENTS USING LASER SPALLATION

(71) Applicant: Intel Corporation, Santa Clara, CA (US)

(72) Inventors: Vivek Raghunathan, Mountain View, CA (US); Yonggang Li, Chandler, AZ (US); Aleksandar Aleksov, Chandler, AZ (US); Adel A. Elsherbini, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/762,548

(22) PCT Filed: Sep. 25, 2015

(86) PCT No.: PCT/US2015/052428
§ 371 (c)(1),
(2) Date: Mar. 22, 2018

(87) PCT Pub. No.: WO2017/052633
PCT Pub. Date: Mar. 30, 2017

(65) Prior Publication Data
US 2018/0308792 A1    Oct. 25, 2018

(51) Int. Cl.
*H01L 23/498* (2006.01)
*H01L 21/48* (2006.01)
(Continued)

(52) U.S. Cl.
CPC .... *H01L 23/49866* (2013.01); *B23K 26/0626* (2013.01); *B23K 26/36* (2013.01);
(Continued)

(58) Field of Classification Search
CPC ......... H01L 21/76894; H01L 21/76802; H01L 21/76804; H01L 21/2885; H01L 21/76873;
(Continued)

(56) References Cited

U.S. PATENT DOCUMENTS 5,219,787 A * 6/1993 Carey ............... H01L 21/31144
257/E21.257
7,832,097 B1 * 11/2010 Huemoeller ......... H05K 1/0219
29/829
(Continued)

FOREIGN PATENT DOCUMENTS

WO    WO-02054493 A1    7/2002
WO    WO-2012087556 A2    6/2012
WO    WO-2017052633 A1    3/2017

OTHER PUBLICATIONS

"International Application Serial No. PCT/US2015/052428, International Search Report dated Jun. 22, 2016", 3 pgs.
(Continued)

*Primary Examiner* — Khiem D Nguyen
(74) *Attorney, Agent, or Firm* — Schwegman Lundberg & Woessner, P.A.

(57) ABSTRACT

Discussed generally herein are methods and devices for flexible fabrics or that otherwise include thin traces. A device can include a flexible polyimide material, and a first plurality of traces on the flexible polyimide material, wherein the first plurality of traces are patterned on the flexible polyimide material using laser spallation.

19 Claims, 11 Drawing Sheets

(51) Int. Cl.
  *B23K 26/06* (2014.01)
  *B23K 26/36* (2014.01)
  *H01L 21/768* (2006.01)
  *B23K 103/16* (2006.01)
(52) U.S. Cl.
  CPC .... *H01L 21/4846* (2013.01); *H01L 21/76865* (2013.01); *H01L 21/76871* (2013.01); *H01L 23/4985* (2013.01); *B23K 2103/16* (2018.08)
(58) Field of Classification Search
  CPC ......... H01L 21/76874; H01L 21/76877; H01L 23/4985; H01L 21/4846; B23K 26/0626; B23K 26/36
  See application file for complete search history.

(56) References Cited

U.S. PATENT DOCUMENTS

| | | | |
|---|---|---|---|
| 9,136,221 B2* | 9/2015 | Raghunathan | H01L 23/49822 |
| 2008/0001297 A1 | 1/2008 | Lotz et al. | |
| 2009/0047783 A1* | 2/2009 | Bchir | H01L 21/2885 438/687 |
| 2009/0212292 A1* | 8/2009 | Hayton | B23K 26/064 257/66 |
| 2011/0058340 A1* | 3/2011 | Li | H05K 3/422 361/728 |
| 2011/0215480 A1* | 9/2011 | Gorczyca | H01L 23/4985 257/774 |
| 2012/0161330 A1* | 6/2012 | Hlad | H01L 24/16 257/774 |
| 2012/0184099 A1 | 7/2012 | Souter | |
| 2013/0318785 A1* | 12/2013 | Hsu | H05K 3/108 29/850 |
| 2015/0048515 A1* | 2/2015 | Zhang | H01L 23/5381 257/774 |

OTHER PUBLICATIONS

"International Application Serial No. PCT/US2015/052428, Written Opinion dated Jun. 22, 2016", 7 pgs.

* cited by examiner

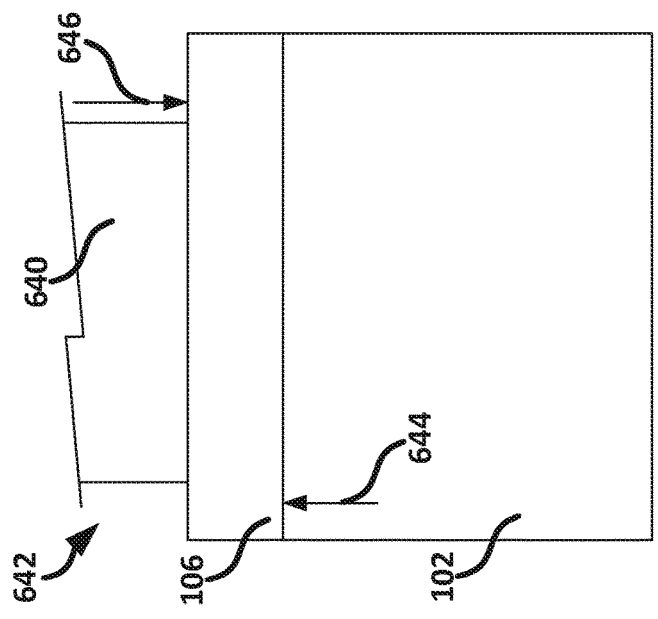
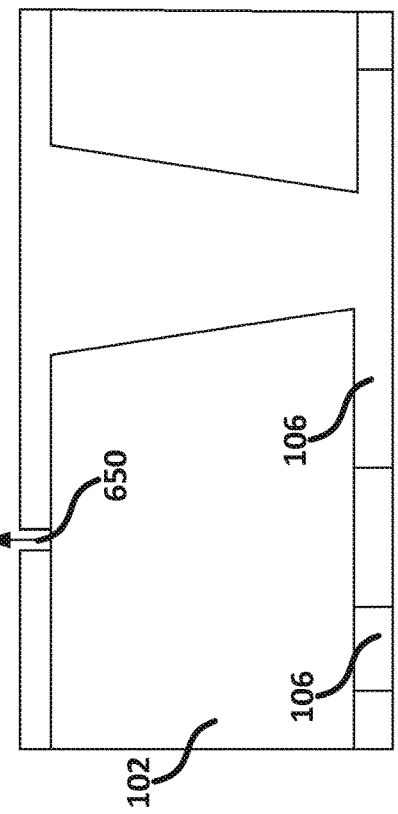
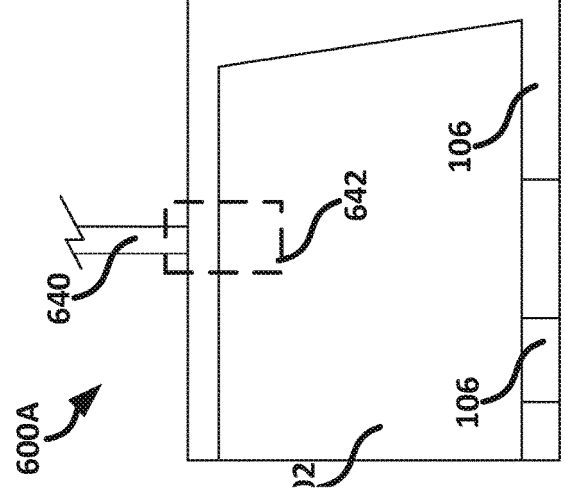

THIN ELECTRONIC PACKAGE ELEMENTS USING LASER SPALLATION

CROSS-REFERENCE TO RELATED APPLICATION

This application is a U.S. National Stage Filing under 35 U.S.C. 371 from International Application No. PCT/US2015/052428, filed on Sep. 25, 2015, and published as WO 2017/052633, which application is incorporated herein by reference in its entirety.

TECHNICAL FIELD

This disclosure relates generally to semiconductor packaging that includes traces produced using laser spallation.

BACKGROUND ART

In laser spallation a high energy pulsed laser (e.g., an excimer laser) creates a compressive force in a material, the compressive force propagates and reflects as a tensile wave. The force of the tensile wave exceeds the local tensile strength of the material and "spalls" the material while propagating. The spatting removes one or more fragments from the material.

BRIEF DESCRIPTION OF THE DRAWINGS

FIGS. 6A-6C illustrate, by way of example, cross-section diagrams describing a laser spallation process.

DESCRIPTION OF THE EMBODIMENTS

Figure 1A:
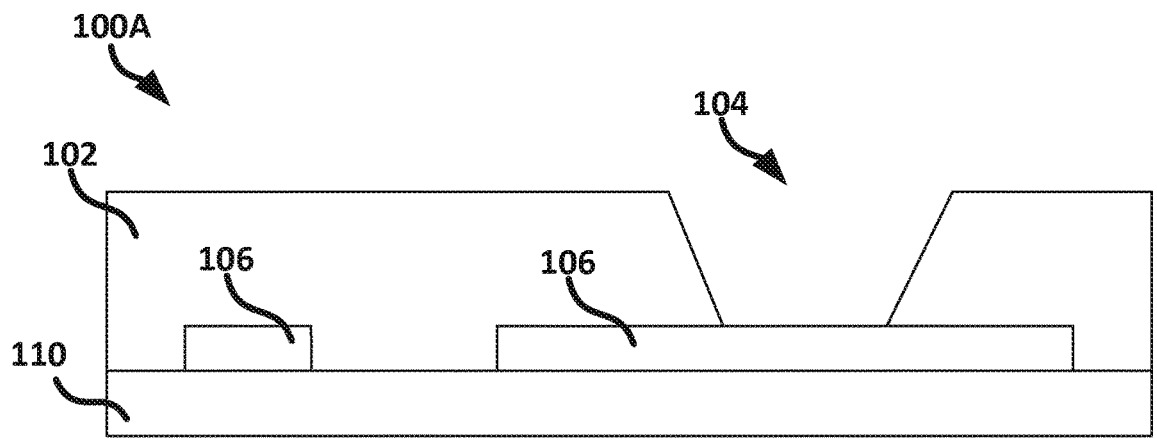
FIGS. 1A-1F illustrate, by way of example, cross-section diagrams of an embodiment of a process for creating traces using a subtractive process.
Figure 1B:
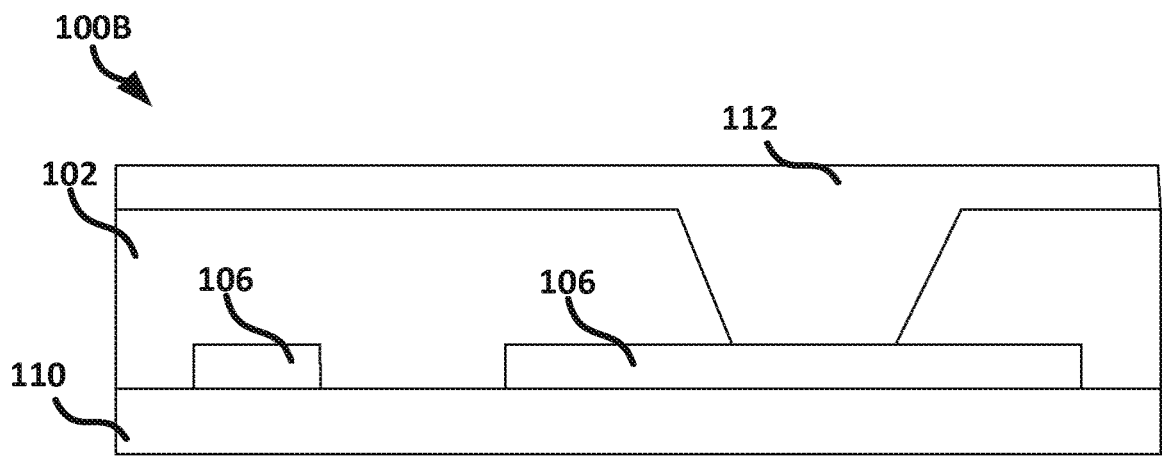

The following description and the drawings sufficiently illustrate specific embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

This disclosure proposes a package architecture that utilizes thin Cu-traces (1-2 um thick) tailored for low power products such as wearables IOT. It is shown in the description that due to the low expected power consumption in the range below 100 mW the usually thick Cu used in package (15-25 um) or board technology (18-36 um) is not needed and products in that power envelope can function well with Cu trace thicknesses at or below 2 um.

The use of thin metal traces opens up patterning methods that can allow for fine line and space (in order to increase component density) and thus decrease system area/volume—an important parameter for wearables and IOT. One novel patterning method that can significantly reduce process cost and complexity is laser spallation. This disclosure focuses on the use of laser spallation as a mean to cost efficiently manufacture products with thin metal traces, however the architectural idea of using thin conductive material can be also achieved with standard subtractive processing (lithography and etch) at a higher cost and if needed also by semi additive processing at an even higher cost. Process flows are shown that can be used to manufacture multi-layer substrate packages. The processes are described with regard to thin traces, but can additionally or alternatively be used to pattern pads including a thickness about the same thickness as the traces. Laser Via drilling on or over thin pads calls for good depth control to avoid damaging or removing the underlying pad. An Excimer laser spallation process can be extended to laser via drilling under such architectures as Excimer lasers have good depth control.

Laser spallation patterning achieves its tow cost by process simplicity—the creation of metal/conductive traces using this technique is completed in only two steps: metal deposition, and the actual patterning is (only one step), namely laser spoliation that replaces all other patterning steps required by currently used processes (subtractive and SAP). A simple process using less tools, space, and having high throughput and material savings i.e. not requiring photoresist, developer, stripper all contribute to the low cost of laser spallation patterning.

Current packages and boards use metal traces that are 15 um or more thick (usually up to 36 um for some flex boards). For wearables, especially those in need of flexibility (conformability, bending-ability) thick traces are detrimental as they can significantly stiffen the package as Cu is by far the material with the highest modulus in the package structure. In comparison to laser spallation patterning, current semi-additive processing (SAP) and subtractive etch approach for substrates require several steps to define metal patterns.

The following manufacturing process flows focus on laser spallation patterning. In case subtractive patterning is used to create thin traces, similar process flows can be used as would be used to create a thick trace with a difference being that a conductive material patterning step will consist of resist material deposition (usually by lamination), exposure, development, conductive material etch and then resist removal. For SAP no change to current SAP process flows are generally needed except for shorter plating times.

FIGS. 1A-1F illustrate, by way of example, cross-section diagrams of an embodiment of a process for creating traces using a subtractive process. The device 100A of FIG. 1A includes a buildup layer 102 that includes one or more via holes 104 extending therethrough. The buildup layer 102 is on a circuit layer that includes traces 106 on another buildup layer 110. The buildup layer 102, 110 can include a flexible substrate material, such as can include polyimide, a silica and/or alumina filled epoxy dielectric, or an acrylate based polymer, among others. The device 100B of FIG. 1B includes the device 100A with a conductive material 112 situated on the buildup layer 102. The conductive material 112 can include copper, tantalum, titanium, nickel, aluminum, gold, silver, or combinations thereof, among others. The conductive material 112 can be deposited as a seed layer using an electroless plating process followed by a via filling process.

Figure 1C:
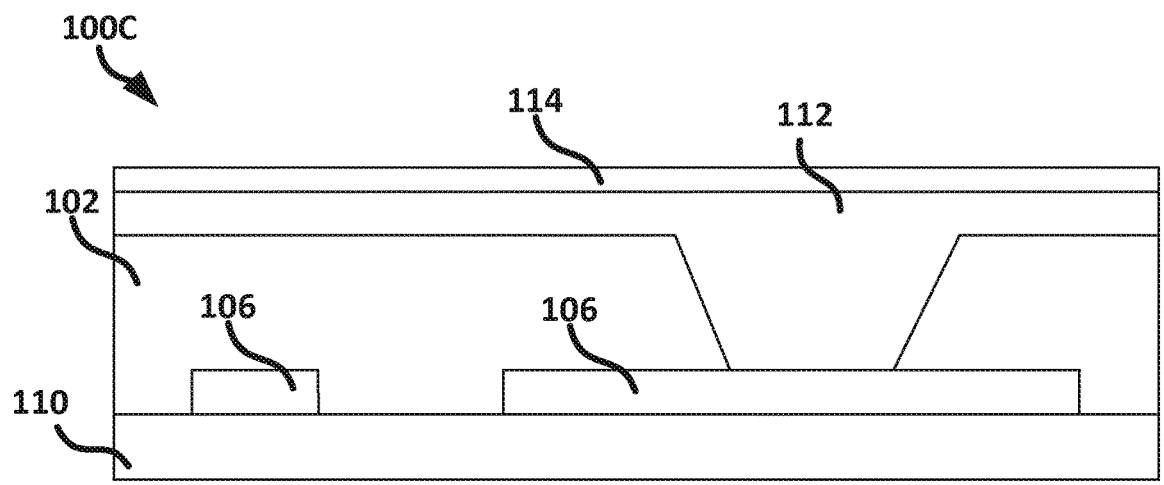
Figure 1D:
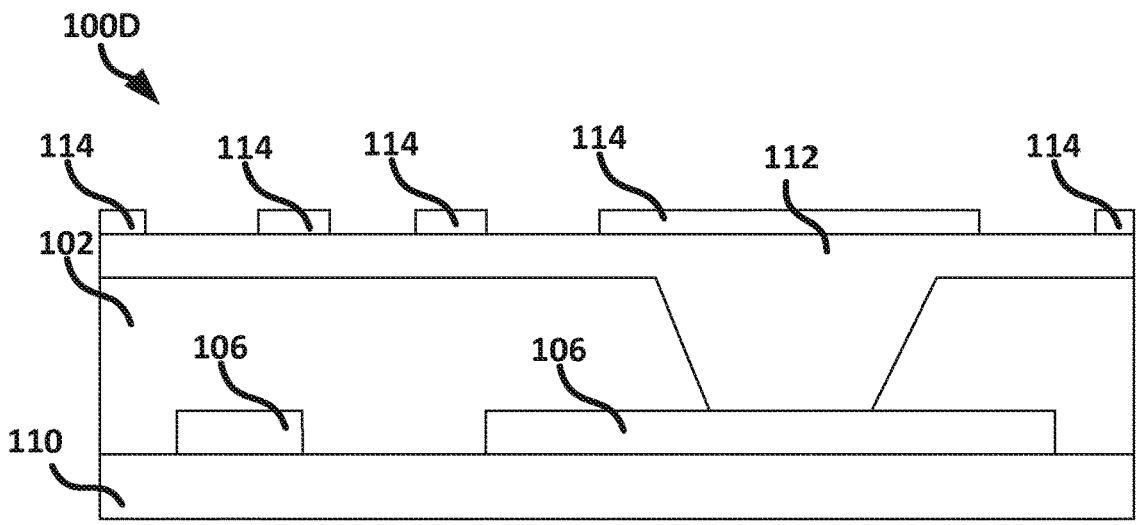
Figure 1E:
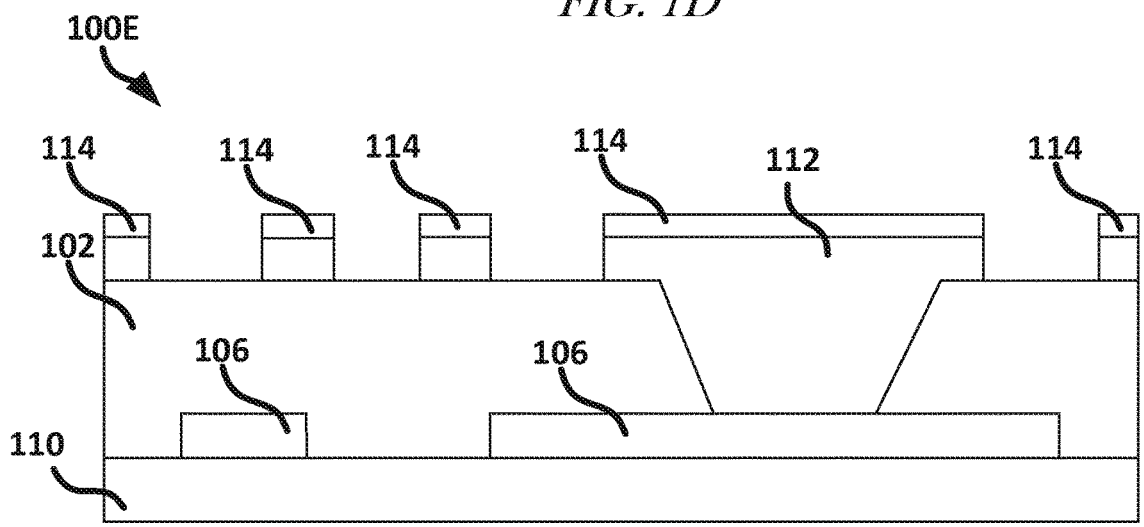
Figure 1F:
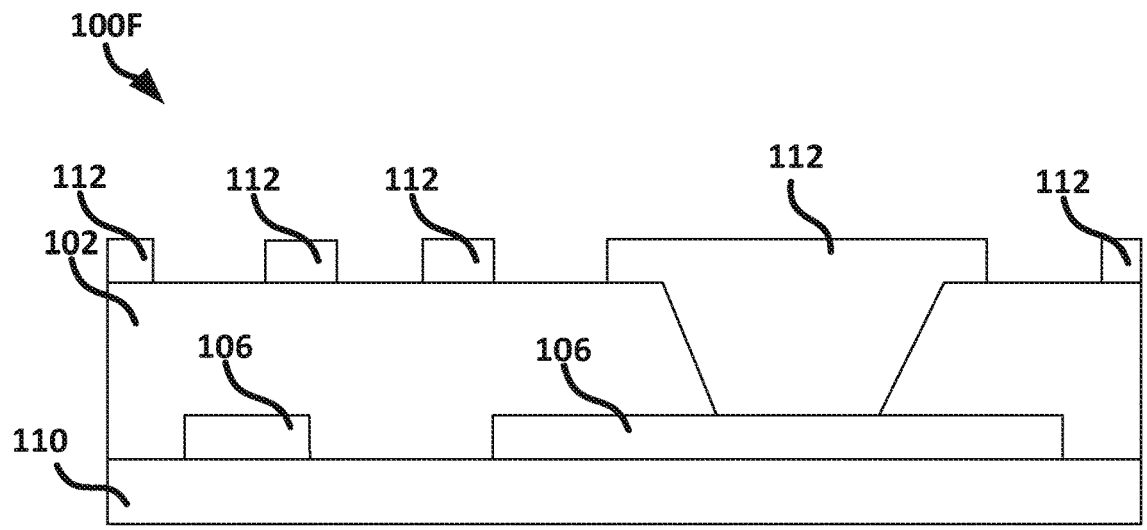

The device 100C of FIG. 1C includes the device 100B with a dry film resist (DFR) 114 laminated on the conductive material 112. The dry film resist 114 can include an ultra violet (UV) sensitive photo material, such as an acrylate or or epoxy based dielectric. For example, a polyimide can be made photo sensitive by adding a photoactive chemical to the polyimide. A cross-linking cure can be made UV activated and an organic film can become less photosensitive. FIG. 1D shows a device 100D that includes the device 100C with the DFR 114 patterned, such as by exposing and developing the DFR 114. The device 100E of FIG. 1E includes the device 100D with conductive material 112 exposed by the DFR 114 wet etched therefrom. The wet etch exposes the buildup layer 102 under portions of the conductive material 112 that were exposed by the DFR 114 expose and develop. The device 100F of FIG. 1F includes the device 100E with the DFR 114 removed therefrom. The DFR 114 can be removed using a wet process, such as by washing with a solution that has a high pH, using a dry plasma process, or otherwise selectively attacks the material being removed. The high pH solution can include tetramethylammonium hydroxide (TMAH), methyl-ethyl amine (MEA), or methyl-2-pyrrolidone (MNP), or a combination thereof. Acetone may be used to remove some DFR materials. The process can be repeated if needed by forming another buildup layer on the buildup layer 102 and the conductive material 112 and then performing the operations described with regard to FIGS. 1A-1F.

FIGS. 2A-2F illustrate, by way of example, cross-section diagrams of an embodiment of a process for creating traces using a semi-additive process (SAP). The device 200A of FIG. 2A includes the device 100A of FIG. 1A with a conductive seed layer 216 sputtered or electrolessly plated on the buildup layer 102 and exposed portions of the traces 106. The conductive seeed layer 216 can include a conductive material that is the same as the conductive material 112 or the traces 106. The device 200B of FIG. 2B includes the device 200A with a resist material 218 laminated on the seed layer 216. The DFR 218 of the device 200B is exposed and developed to form the device 200C of FIG. 2C. The exposing and developing of the DFR 218 exposes portions of the conductive seed layer 216.

Figure 2A:
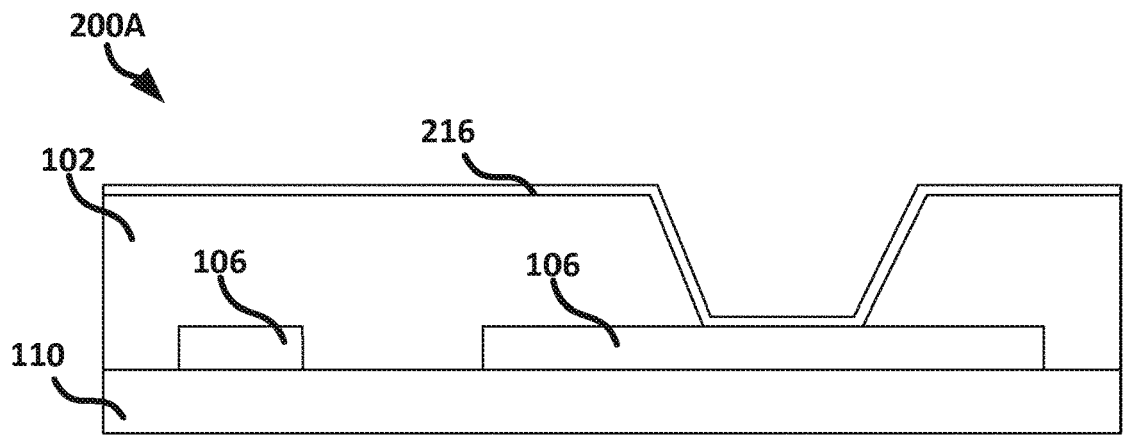
FIGS. 2A-2F illustrate, by way of example, cross-section diagrams of an embodiment of a process for creating traces using a semi-additive process.
Figure 2B:
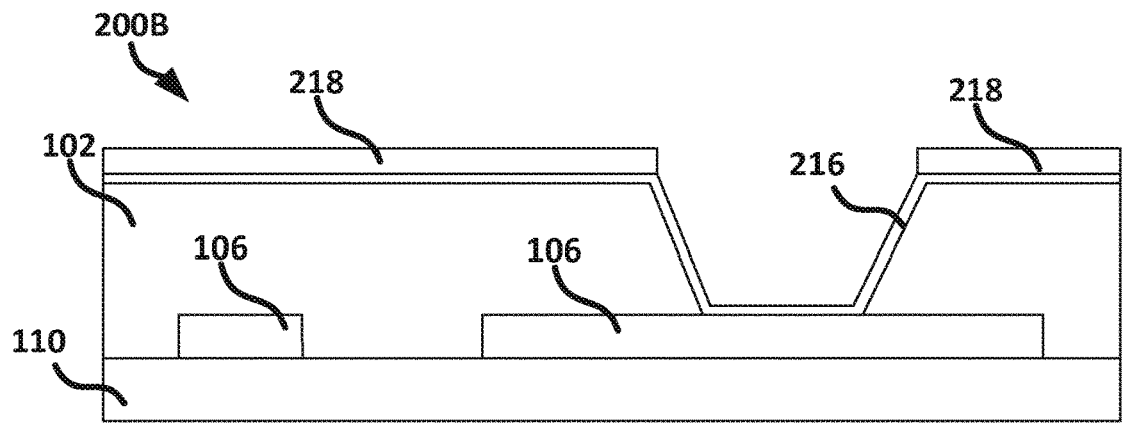
Figure 2C:
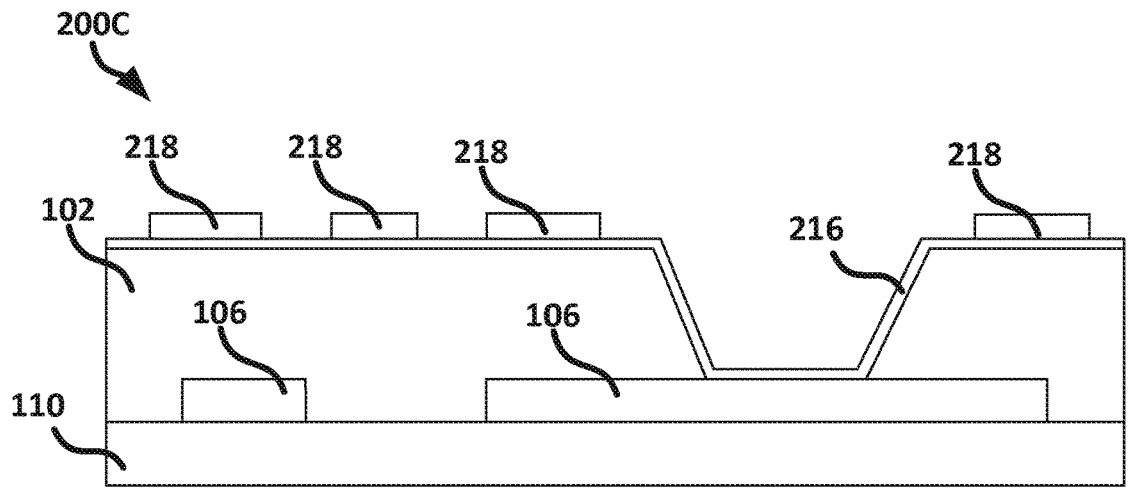
Figure 2D:
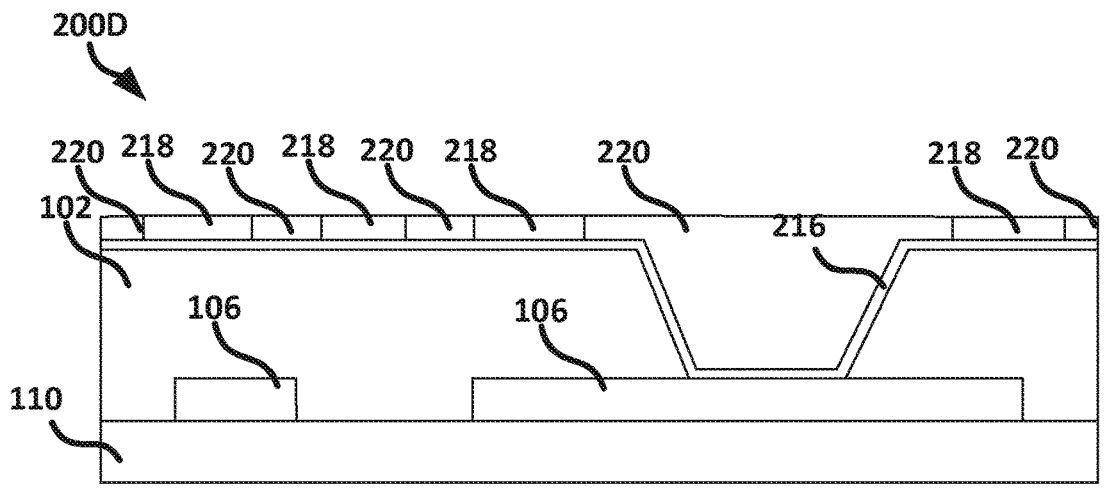
Figure 2E:
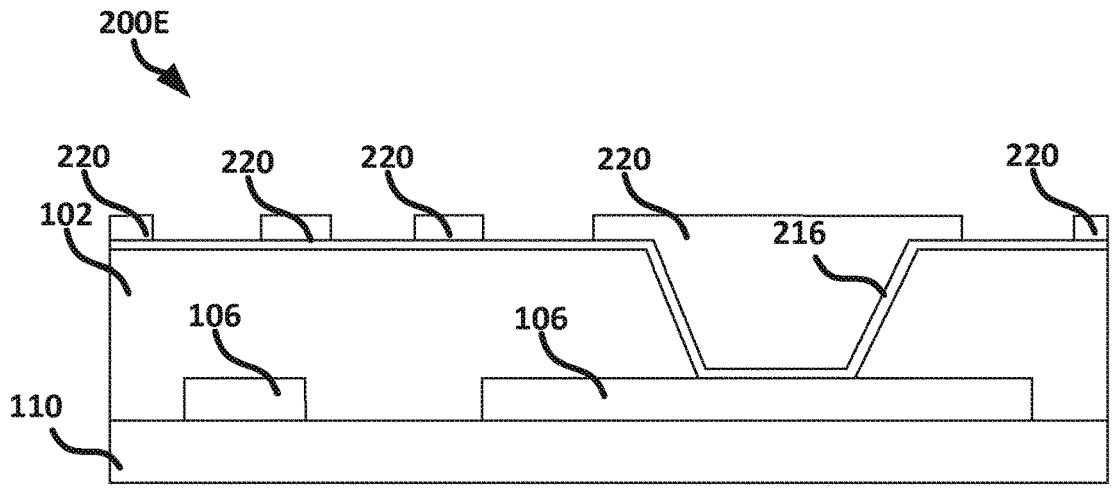
Figure 2F:
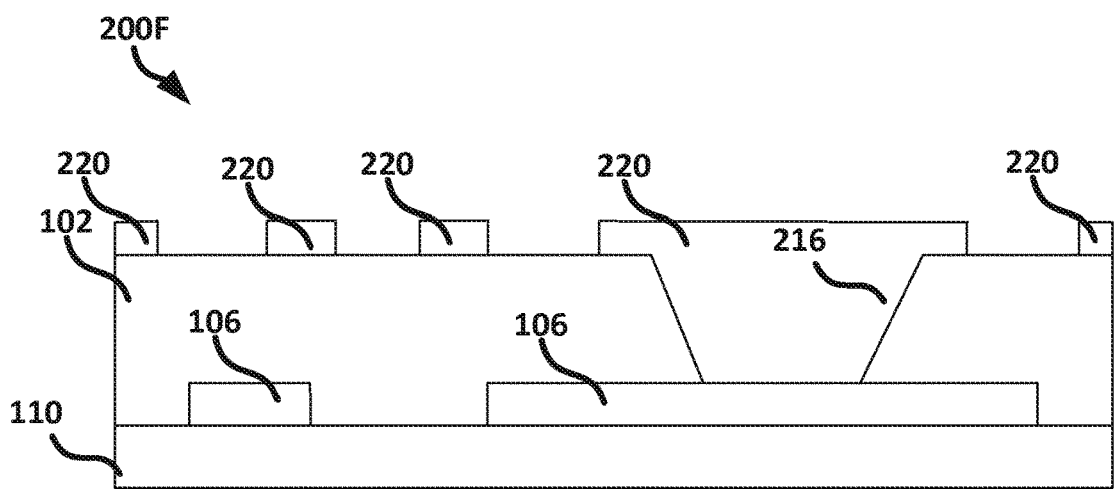
Figure 3A:
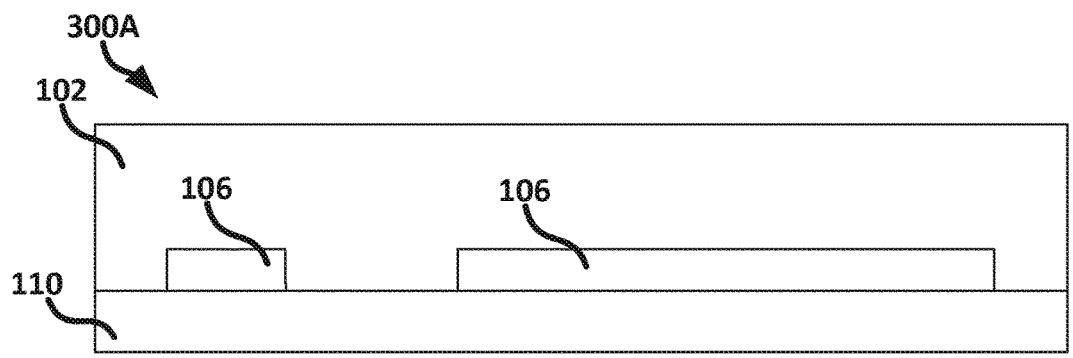
FIGS. 3A-3D illustrate, by way of example, cross-section diagrams of an embodiment of a process for creating thin traces using laser spallation.
Figure 3B:
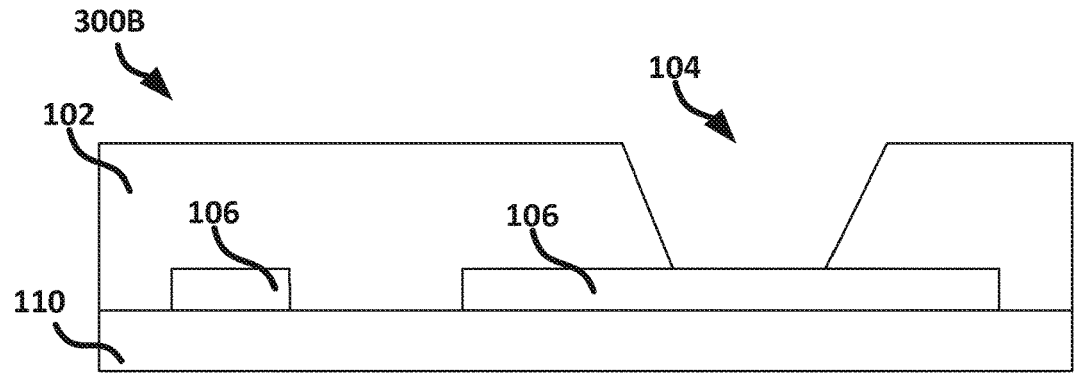
Figure 3C:
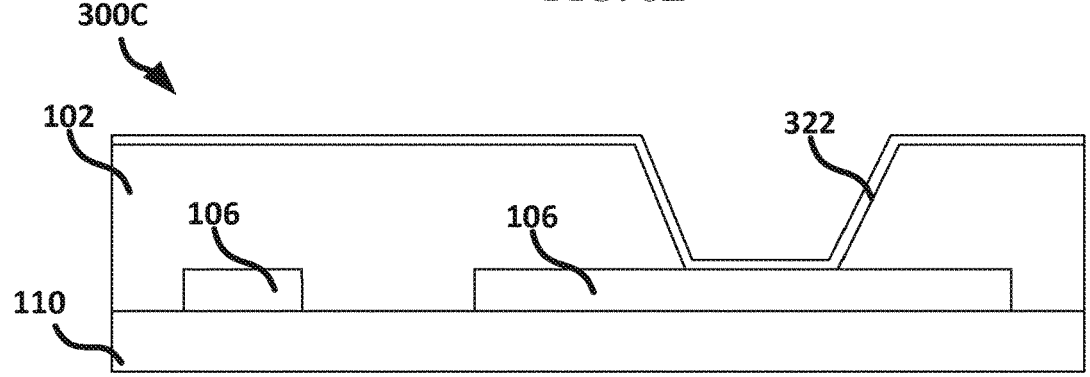
Figure 3D:
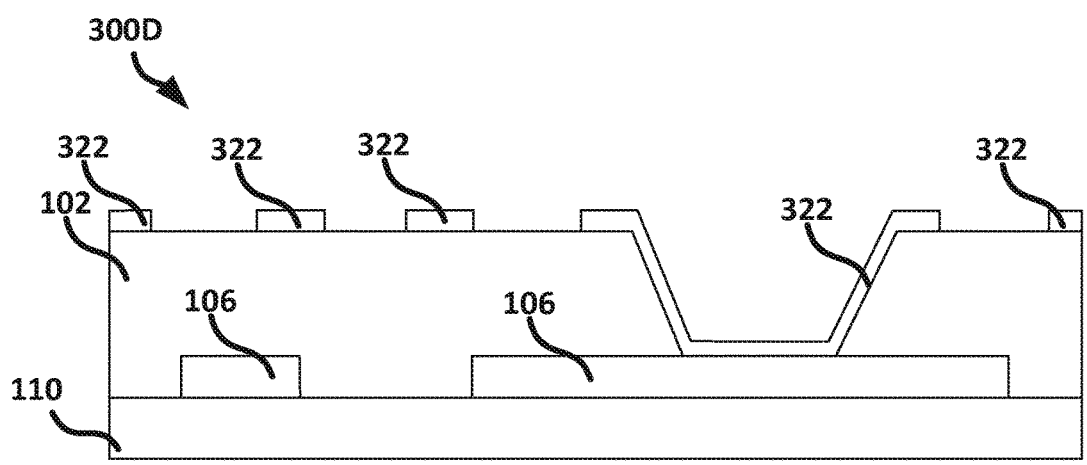

The device 200D of FIG. 2D includes the device 200C with a conductive material 220 electrolytically plated on the exposed portions of the conductive seed layer 216. FIG. 2E shows a device 200E that includes the device 200D with the DFR 218 removed therefrom, such as to expose portions of the conductive seed layer 216 between the conductive material 220. The device 200F of FIG. 2F includes the device 200E after a flash etch (e.g., a wet or a dry etch) to remove the portions of the conductive seed layer 216 exposed after removing the DFR 218.

Three process flows are presented tier manufacturing packages with thin traces using laser spallation patterning. The processes can include via drilling of incoming dielectric or dielectric with conductive material and polyethylene terephthalate (PET). Metallization of via and trace pattern can be defined in one of four different ways, such as can depend on the resistance/power requirements of the device:

1) An electroless process can be used for via filling and metallization on pattern layer in one step; 2) An electroless process can be used for seed layer deposition and an electrolytic process can be used for via filling; 3) An electroless process can be used for filling a via hole (Blind Via Hole (BVH)) filling and another electroless process can be used for a pattern layer; and 4) An electroless process can be used for BVH filling, and a PET removal process can be used to expose the incoming blanket copper. A final patterning step involves laser spallation to define the appropriate pattern.

Option 1 is the cheapest option but leaves topographic features for thick dielectric layers. For thin dielectric materials with thicknesses of less than or equal to 5 um over the lower metal layer (i.e. maximum via depth less than or equal to 5 um) the topography would be negligible and does not differ from the topography otherwise present on substrates.

FIGS. 3A-3D illustrate, by way of example, cross-section diagrams of an embodiment of a process for creating thin traces using laser spallation. The device 300A of FIG. 3A includes the device 100A before a via is drilled through the buildup layer 102 to the trace 106. The device 300B of FIG. 3B includes the device 300A with the via hole 104 drilled therein. The device 300C includes a layer of conductive material 322 (e.g., a seed layer) plated on the buildup layer 102 and exposed portions of the traces 106 using an electroless process. The conductive material 322 can be thin enough so that a laser spallation process can penetrate through to the buildup layer 102 and remove portions of the conductive material 322. In an embodiment in which the conductive material 322 is copper, the conductive material can be up to about two micrometers thick. The amount of energy required to be produced by the laser to sufficiently spallate the conductive material 322 depends on a number of factors including the materials which make up the conductive material 322, the material which makes up the buildup layer 102, and the thickness of the conductive material 322.

Figure 4A:
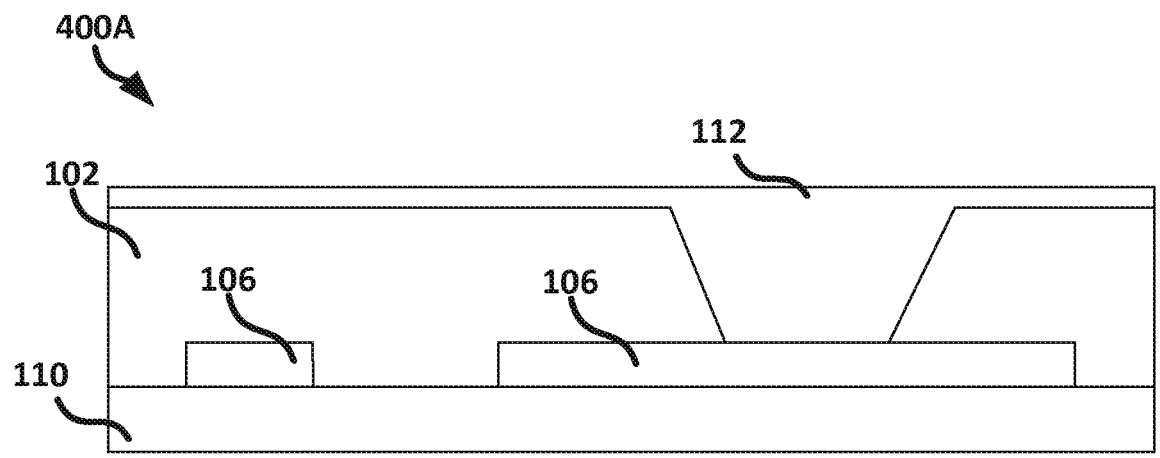
FIGS. 4A-4B illustrate, by way of example, cross-section diagrams of an embodiment of another process for creating thin traces using laser spoliation.
Figure 4B:
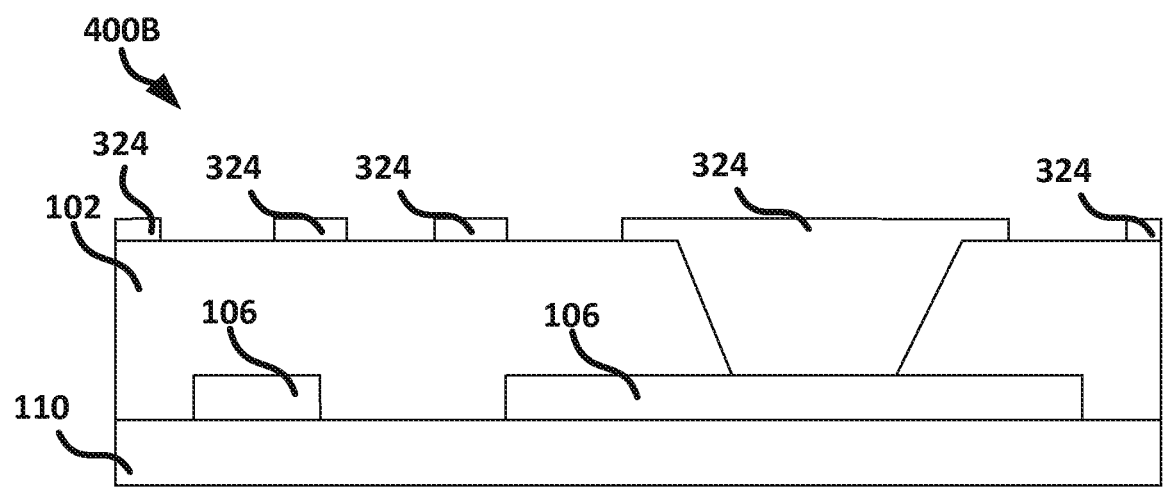

FIGS. 4A-4B illustrate, by way of example, cross-section diagrams of an embodiment of another process for creating thin traces using laser spallation. The device 400A of FIG. 4A is similar to the device 300C of FIG. 3C with the device 400A including conductive material situated in the via hole using an electrolytic process. Alternatively, the device 400A of FIG. 4A is similar to the device 300B of FIG. 3B with the device 400A including the conductive material built up using a bottom up plating of BVH using an electroless plating process and another electroless plating process for patterning. The device 400B of FIG. 4B shows the device 400A with the conductive material 112 spallated so as to pattern the conductive material 112 into traces 324.

Figure 5A:
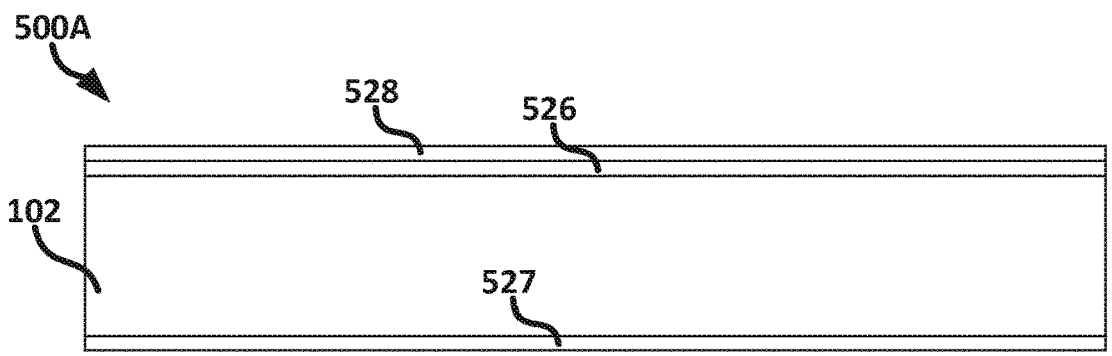
FIGS. 5A-5D illustrate, by way of example, cross-section diagrams of an embodiment of yet another process for creating thin traces using laser spallation.
Figure 5B:
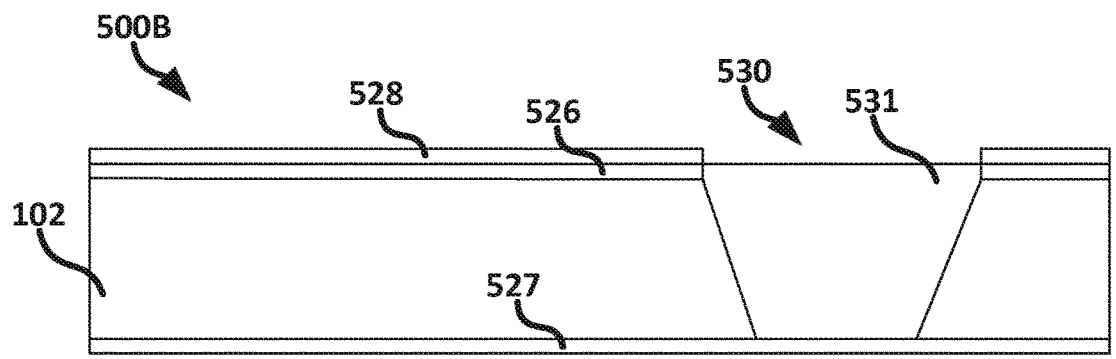
Figure 5C:
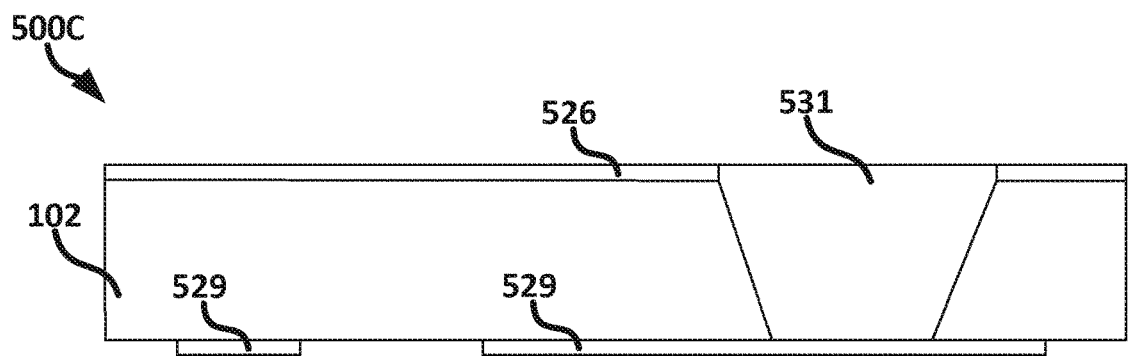
Figure 5D:
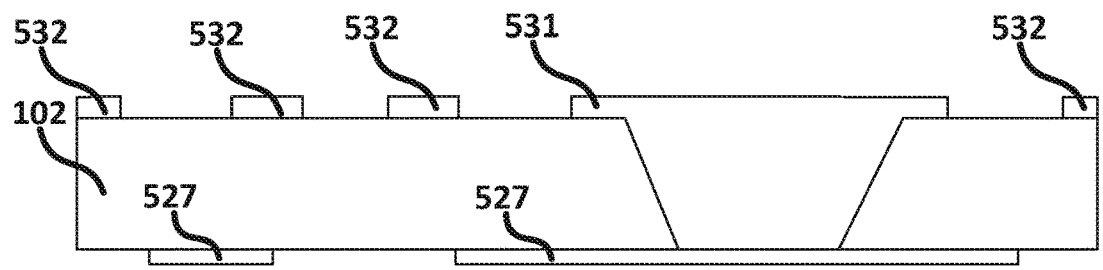

FIGS. 5A-5D illustrate, by way of example, cross-section diagrams of an embodiment of another process for creating thin traces using laser spallation. The device 500A of FIG. 5A includes the buildup layer 102 with a first conductive material 526 on a first surface of the buildup layer 102 and a second conductive material 527 on a second surface of the buildup layer 102. The device 500A further includes a sacrificial material 528 (e.g., a polyethylene terephthalate (PET) material or a photoresist material) 528 on the conductive material 526. The material 528 protects the conductive material 526 from plating when the via region is being electrolessly plated. FIG. 5B illustrates a device 500B that includes the device 500A with a via hole 530 formed therein, such as through the material 528, and subsequently filled. A bottom up electroless plating process can be used to form conductive material 531 in the via hole 530. The material 528 can be removed from the device 500B, such as shown in device 500C of FIG. 5C. A laser spallation process can be used to pattern the conductive material 527 into traces 529, such as shown in FIG. 5C. A laser spallation process can be used to pattern the conductive material 526 of FIG. 5C into traces 532 as shown in device 500D of FIG. 5D. Note that while the material 528 is only illustrated on one side of the buildup layer 102, the material 528 can be used on both sides of the layer 102 to help protect conductive material from being plated in a via hole plating process.

FIGS. 6A-6C illustrate, by way of example, cross-section diagrams describing a laser spallation process. FIG. 6A illustrates a device 600A similar to the device 400A and 500C with the device 600A including a laser 640 incident on the device 600A in the region indicated by the dashed box 642. FIG. 69 illustrates a blown up view of the region indicated by the dashed box 642. The laser 640 creates a compressive wave pressing the conductive material 106 into the buildup layer 102, as is indicated by arrow 646. A tensile wave presses on the conductive material 106 in a direction opposite the compressive wave, as is indicated by the arrow 644. The two waves in combination shear the conductive material 106 in the region at which the laser is incident on the conductive material 106. FIG. 6C illustrates a device 600C that includes the device 600A after a portion of conductive material 648 is removed therefrom, such as is indicated by arrow 650.

The laser excites evaporation and plasma generation on the conductive material (e.g., trace 106) surface, which generates a compressive shock wave in the conductive material. When the shock wave is reflected back from the conductive material-dielectric (e.g., buildup layer 102) interface it generates a tensile stress in the conductive material and shears a portion of the conductive material off of the dielectric. Part of the laser energy is absorbed by the conductive material and turned into heat causing softening of the conductive material. The tensile stress is strong enough to pull the laser radiated conductive material from the dielectric interface and the adjacent conductive material, as long as the conductive material is sufficiently thin. Thus, a pattern can be generated on a conductive material of appropriate thickness on a dielectric if it is exposed to laser radiation at selected areas. Spallation is distinct from ablation in that ablation includes evaporating, sublimating, and/or plasmifying material, while spallating ejects solid and/or liquid material using the process previously discussed.

An excimer laser, UV laser (e.g., a 335 nanometer or 355 nanometer wavelength laser), carbon dioxide ($CO_2$) laser (e.g., a 9.44 micrometer or 10.2 micrometer CO2 laser), or a green laser can be used to generate sufficient pulse energy that can pattern the conductive material, such as when an exposure mask is used. The wavelength of the laser can be a variety of wavelengths including a 248 nanometer, a 193 nanometer, or a 305 nanometer. The laser can be chosen based on the material(s) and the thickness of the material(s) to be spallated. The required laser fluence depends on the conductive material and dielectric (e.g., buildup layer or substrate material) combination and conductive material thickness. In an example, a copper and first buildup film interface created using an electroless process requires a fluence of around 1000 $mJ/cm^2$, while a sputtered titanium and second buildup film interface requires a fluence of around 350 $mJ/cm^2$.

The FLS resolution is governed by the metal/dielectric combination and the fluence. An FLS capability of 4/3 (where 4 micrometers is the trace width and 3 micrometers is the space width between the traces) is possible for 250 nm and 500 nm thick Cu deposited on a buildup film using an electroless plating process. The best possible spacing depends on the dielectric material used and the associated interfacial roughness between the conductive material and the dielectric. For a 2 μm thick copper, a spacing resolution of less than 10 μm can be achieved if the underlying dielectric is a first buildup film, while a second buildup film material underlying a 2 um thick copper includes a spacing resolution around 35 μm. The resolution improves as the thickness of the conductive material is reduced. The edges of the conductive material are of acceptable quality (see FIG. 8A-C and the corresponding description thereof) and the conductive material can adhere well to the dielectric, such as up to the edge of the conductive material. The laser spallation can be designed to require only 1 pulse for metal removal resulting in high throughput of, for example, around 55 panels per hour assuming a 150 W available laser power at the device being spallated and a fluence of 1 $J/cm^2$ or more.

Figure 7A:
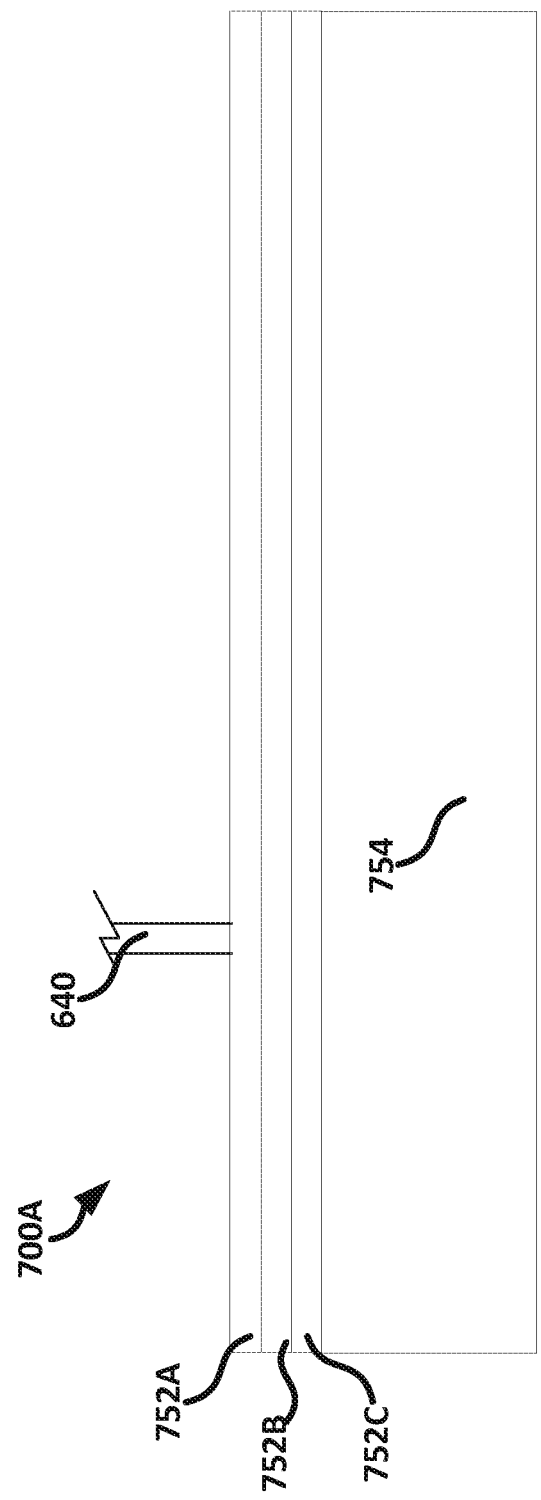
FIGS. 7A-7B illustrate, by way of example, cross-section diagrams of an embodiment of a process for creating traces that include stacked conductors using laser spallation.
Figure 7B:
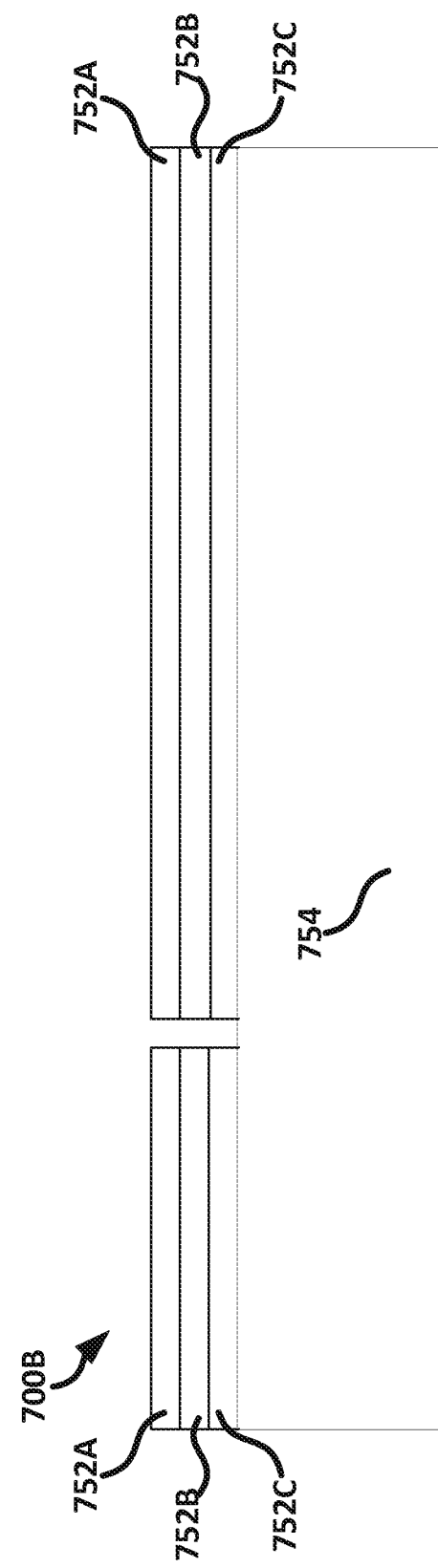

FIGS. 7A-7B illustrate, by way of example, cross-section diagrams of an embodiment of a process for creating traces that include stacked conductors using laser spallation. Using laser spallation to create these traces can simplify wet etch processes that require different etch chemistries for different conductive materials. The device 700A depicted in FIG. 7A includes three (different or same) materials 752A, 752B, and 752C stacked on top of one another. The materials 752A-C can then be spallated by the laser 640, such as to pattern the materials into traces or other object, such as a capacitor, such as is shown in the device 700B of FIG. 7B. For all of the materials to be spallated by the laser 640, the thickness of the materials 752A-C needs to be carefully regulated. The tensile strengths of the materials 752A-C should remain less than the shear forces created by the tensile wave and the compressive wave. Stacking materials and spallating can provide one or more advantages, such as can include simplified processing over wet etch processing, useful magnetic and/or ferromagnetic properties, and/or a simple process to create a passive component, such as a capacitor.

The materials 752A-C can include one or more of copper, tantalum, gold, aluminum, titanium, an alloy thereof, a dielectric material or a combination thereof. The traces could serve multiple functions, such as by having a first layer of conductive material perform a first function and a second conductive material perform a second function. The function can include interacting with a specific magnetic or electrical property of a signal or providing an etch stop layer for a wet etch process. The combination can include a magnetic and non-magnetic conductive material to provide different transport properties for electrical signals. Multiple conductors can be used to create an actuation or bending moment. A first conductive material in the stack can include a better adhesion property while a second conductive material in the stack include lower resistance so as to transport an electrical signal with lower loss. In a stack of three conductive materials, a top and bottom conductive material can include a better adhesion strength with the buildup layer while the center conductive material is used for signal transport. A top conductive material of a stack, such as a material that may be exposed to an external environment or otherwise may be more likely to be exposed to oxygen, may be more resistant to oxidation than a low resistance conductive material for the bulk of the conductivity. A top conductive material of a stack, such as a material that may be exposed to an internal environment of a human or other animal body, can be a biocompatible material. Conductive materials that have a strong adhesion property include titanium, tantalum, and molybdenum. Conductive materials that have a low resistance to electron flow include copper and gold. Conductive materials that provide protection from oxidation include silver, gold, and platinum. Conductive materials that are biocompatible include gold, platinum, and molybdenum.

In one or more embodiments, a copper can be stacked on a silicon nitride dielectric (or other dielectric) that is stacked on another copper layer. These layers, after spallation, can form a capacitor, such as can be thin and within a substrate. The materials 752A-C can be deposited using an electrolytic process, an electroless process, a sputtering process, a plasma vapor deposition process, or a chemical vapor deposition process.

Figure 8A:
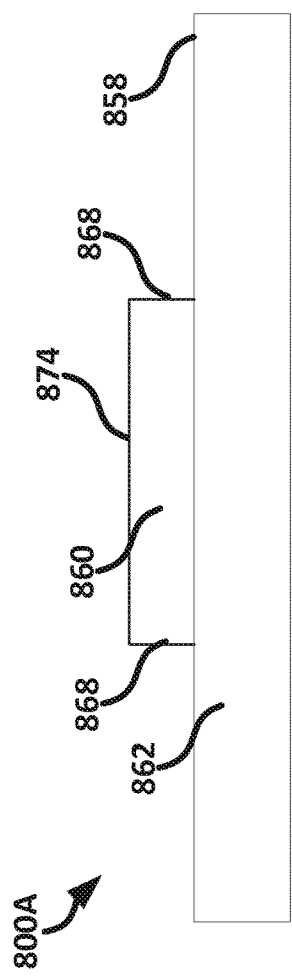
FIGS. 8A, 8B, and 8C illustrate, by way of example, exploded cross-section views of devices that include traces created using a laser spallation process, a subtractive process, and a semi-additive process, respectively.
Figure 8B:
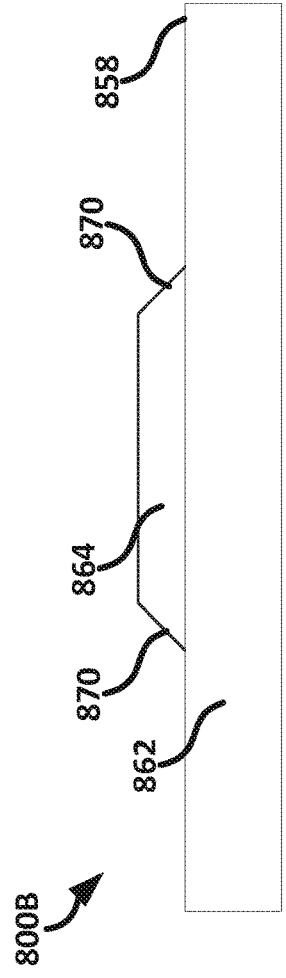
Figure 8C:
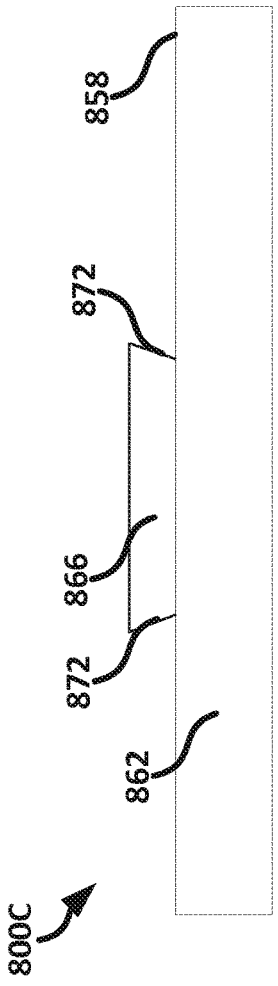

FIGS. 8A, 8B, and 8C illustrate, by way of example, exploded cross-section views of devices that include traces created using a laser spallation process, a subtractive process, and a semi-additive process, respectively. The device 800A of FIG. 8A includes a trace 860 on a substrate 862, where the trace 860 was created using a laser spallation process, such as the process shown in FIGS. 3A-3D, FIG. 4A-B, or FIGS. 5A-D. The device 800B of FIG. 8B includes a trace 864 on the substrate 862, where the trace 864 was created using a subtractive process, such as the process shown in FIGS. 1A-F. The device 800C of FIG. 8C includes a trace 866 on the substrate 862, where the trace 866 was created using a semi-additive process, such as the process shown in FIGS. 2A-F.

As is shown in the FIGS. 8A-C sidewalk 868 of the trace 860 are oriented more perpendicular to a top surface 858 of the substrate 862 than sidewalls 870 of the trace 864 and also sidewalls 872 of the trace 872. This is a natural result of the process used to create the respective trace 860, 864, and 866. The trace 864 created using the subtractive process includes sidewalls 870 tapering out from the center of the trace 864, while the additive process includes sidewalls 872 tapering in from the center of the trace 866.

Using traces created using a laser spallation process can be advantageous for flexible circuit technologies. The normally thick traces (e.g., 15-36 micrometers in the case of copper) can be replaced with thin traces (e.g., 1-4 micrometers thick in the case of copper). Note that the thickness of the trace is measured from the top surface of the material on which it is situated to a top surface of the trace (e.g., from the top surface 858 to top surface 874).

The laser spallation technique can be employed for the manufacturing of wearables/internet of things (JOT) packages, for example. Such packages allow for reduced manufacturing complexity (e.g., fewer manufacturing steps to produce the package as is illustrated by comparing the number of steps in the processes of FIGS. 1A-F, 2A-F, 3A-D, FIGS. 4A-B, and FIGS. 5A-D) and reduced cost. The method involves sending a laser pulse onto a conductive film (e.g., a conductive material, stacked conductive materials, or stacked conductive and dielectric materials) on a dielectric (e.g., the buildup layer 102, 110 or the substrate 754, 862 as is explained with regard to FIGS. 6A-C.

Using thin Cu traces of 1-2 um thickness can have one or more of several advantages: reduced package rigidity (i.e. increased flexibility, which can be important for wearables/IOT or other technology that requires a flexible package); low cost patterning methods such as laser spallation can be employed in manufacturing; reaching fine line and space of 10 um space/10 um lines (10/10) or below by both laser spallation patterning and subtractive patterning (in the case of subtractive patterning, the thin conductive material helps enable the fine line and space (FLS) as the space widening during etch is minimal; laser spallation can include up to 4/3 FLS capability and can be further scaled down with process engineering, which is finer than the best resolution achieved using the current SAP or subtractive etching process in substrate and PCB volume manufacturing.

The maximum thickness of Cu traces that can be patterned by laser spallation is around 2-4 micrometers. This limit on the trace thickness limits the power envelope of the product in which this technology can be used. For low power applications (which includes most wearable devices) and systems not in need of the highest bandwidth (BW); there is no risk of BW or power losses due to the higher resistivity of the thin traces. Table 1 gives a minimum line width for a trace that does not violate the rule of having a voltage drop of greater 50 mV (note that usually around 100 mV voltage drop can be tolerated for power delivery). The minimum trace widths increase with increasing current levels and decreasing copper thickness (Table 1). Power delivery over a trace length of 1 centimeter is assumed for comparison.

TABLE 1

| CURRENT (A) | WIDTH of 18 um THICK COPPER (um) | WIDTH OF 0.5 um THICK COPPER (um) |
| --- | --- | --- |
| 1.00E−06 | 1.92E−04 | 6.90E−03 |
| 1.00E−05 | 1.92E−03 | 6.90E−02 |
| 1.00E−04 | 1.92E−02 | 6.90E−01 |
| 1.00E−03 | 1.92E−01 | 6.90E+00 |
| 1.00E−02 | 1.92E+00 | 6.90E+01 |

With the present technology, there can be several traces delivering power/ground connections due to the FLS capabilities. Moreover, the power delivery lines can be wider than the widths identified in Table 2 and also shorter than 1 cm.

Signaling lines (e.g., data lines to Low Power Double Data Rate (LPDDR) memory) can have high resistance, in the order of several ohms, without significant impact on performance. The LPDDR spec allows for driver output resistance variations of up to 20 ohms. In laser spoliation patterning, using a trace thickness of about 2 um requires around 17.25 μm wide trace for a current carrying capability of 10 mA without violating the 50 mV voltage drop rule. For the finest line width of 1 um at this Cu thickness (Table 2) the current carrying capability of a 2 um thick trace is about 5.8 mA. This is a conservative estimate considering that the power delivery traces are usually well below 1 cm long and significant portions of the power delivery are carried vertically through vias. However, even with this conservative estimate, a substrate for a die with the electrical current requirement of less than or equal to 1 A (and at our current operating voltages) and a power requirement of less than or equal to 1 W can be fabricated using laser spallation to create thin traces with just 100 power traces (and 100 ground traces). Such a configuration satisfies the power envelope for many, if not all, wearable and many mobile applications.

While laser spoliation patterning is beneficial due to its low cost and simplicity of implementation, subtractive patterning and even SAP can be employed to manufacture substrates with thin Cu traces, although SAP is certainly the most costly choice. For subtractive patterning the thin Cu means that 10 um/10 um line/space (L/S) and 8/10 (US) can be obtained. The same L/S with thick Cu can be achieved with SAP but not with a subtractive process.

As is discussed previously, laser spoliation for traces (e.g., pads, vias, interconnect lines, or other metallization on or in a substrate) can be used to selectively remove conductive material from the dielectric (i.e. it can be used for patterning directly by using the energy of the laser beam).

Laser spallation can be used to pattern microvia and pad openings in the dielectric. In the proposed thin metal architecture, the use of conventional laser sources like carbon dioxide (CO2) and ultraviolet (UV) can generally not be used for via hole drilling and pad opening creation owing to low marginality to underlying pad removal, since thin conductive materials can be ablated by CO2/UV lasers, thus causing a short in the circuit. However, the proposed excimer laser source can be easily controlled (by pulses and masked exposure, such as by providing a mask on the laser in a path of the laser light) to create the microvia and pad openings without damaging the thin underlying pad. In case of thinner dielectric layers, the proposed solution is cost advantageous owing to simultaneous patterning and via formation through mask.

For the thin conductive material, laser spallation, SAP, and subtractive processes can be detected by cross-sectioning the substrate and inspection of the cross-section by optical microscope. Detection can focus on the edge quality of the patterned features (such as traces, pads, and planes). The edges are rougher (in the range of 0.1-0.3 μm root mean square (rms) deviation from a straight edge) than the existing technologies (less than 0.1 μm rms for SAP and subtractive patterning). Laser spallation patterning will also remove dielectric material around the sidewalls of spallated conductive material, while the SAP and subtractive processes generally do not attack the dielectric in these locations. Thus, a device created using a laser spallation process includes conductive material with rougher sidewalls and the dielectric is rougher near the sidewalls of the conductive material. This is at least partially due to the fact that the interface between the dielectric material and the conductive material generally does not have a perfectly flat surface for the energy wave to reflect on.

Figure 9:
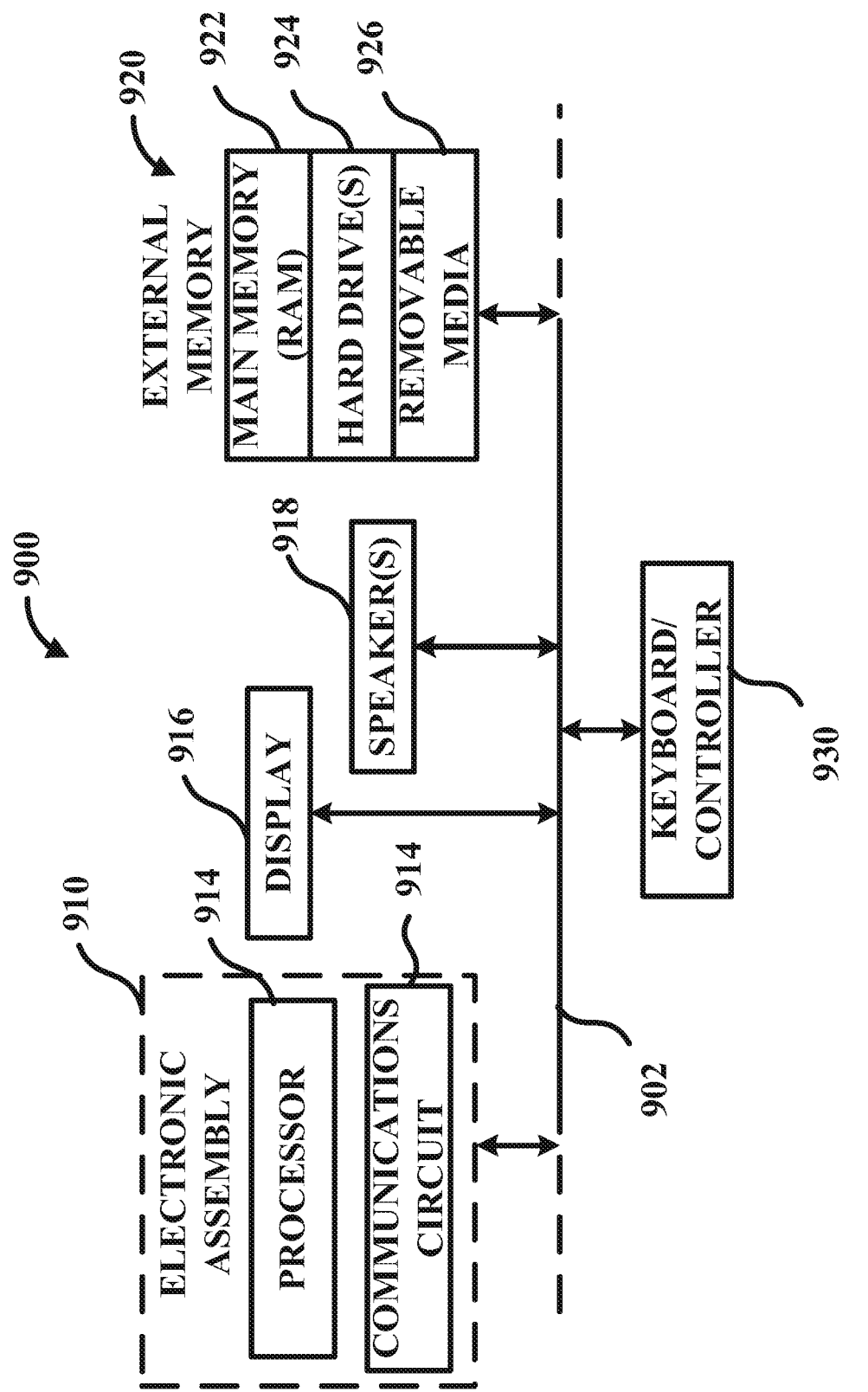
FIG. 9 shows a block diagram example of an electronic device which can include a multi-chip package as disclosed herein.

FIG. 9 shows a block diagram example of an electronic device which can include a multi-chip package as disclosed herein. An example of an electronic device using one or more packages with one or more laser spallated structures (e.g., traces or capacitors) is included to show an example of a device application for the present disclosure. Electronic device 900 is merely one example of a device in which embodiments of the present disclosure can be used. Examples of electronic devices 900 include, but are not limited to, personal computers, tablet computers, supercomputers, servers, telecommunications switches, routers, mobile telephones, personal data assistants, MP3 or other digital music players, radios, etc. In this example, electronic device 900 comprises a data processing system that includes a system bus 902 to couple the various components of the system. System bus 902 provides communications links among the various components of the electronic device 900 and can be implemented as a single bus, as a combination of busses, or in any other suitable manner.

An electronic assembly 910 is coupled to system bus 902. The electronic assembly 910 can include a circuit or combination of circuits. In one embodiment, the electronic assembly 910 includes a processor 912 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 910 are a custom circuit, an application-specific integrated circuit (ASIC), or the like, such as, for example, one or more circuits (such as a communications circuit 914) for use in wireless devices like mobile telephones, pagers, personal data assistants, portable computers, two-way radios, and similar electronic systems. The IC can perform any other type of function.

The electronic device 900 can include an external memory 920, which in turn can include one or more memory elements suitable to the particular application, such as a main memory 922 in the form of random access memory (RAM), one or more hard drives 924, and/or one or more drives that handle removable media 926 such as compact disks (CD), digital video disk (DVD), and the like.

The electronic device 900 can also include a display device 916, one or more speakers 918, and a keyboard and/or controller 930, which can include a mouse, trackball, touch screen, voice-recognition device, or any other device that permits a system user to input information into and receive information from the electronic device 900.

ADDITIONAL NOTES AND EXAMPLES

In Example 1 a device can include a flexible polyimide material and a first plurality of traces on the flexible polyimide material, wherein the first plurality of traces are patterned on the flexible polyimide material using laser spallation.

In Example 2, the device of Example 1 includes, wherein the traces include copper traces that are between about 0.5 micrometers and 2 micrometers thick.

In Example 3, the device of at least one of Examples 1-2 includes, wherein the plurality of traces is a first plurality of traces on a first surface of the polyimide material and the device further comprises a second plurality of traces on a second surface the flexible polyimide material, the second surface of the polyimide material opposite the first of the polyimide material, wherein the second plurality of traces are patterned on the flexible polyimide material using laser spallation such that the second plurality of traces include sidewalk that are more perpendicular to the second surface of the polyimide material when the polyimide material is in an unstressed position than traces created using a semiadditive process and second traces created using a subtractive process.

In Example 4, the device of at least one of Examples 1-2 includes, wherein the traces include a plurality of different stacked conductive materials including two or more of gold, silver, titanium, tantalum, molybdenum, copper, aluminum, and platinum.

In Example 5, the device of Example 4 includes, wherein the plurality of different stacked conductive materials includes two conductive materials including one of silver, gold, and platinum stacked on one of copper and gold.

In Example 6, the device of Example 4 includes, wherein the plurality of different stacked conductive materials includes two conductive materials including one of copper and gold stacked on one of titanium, tantalum, and molybdenum.

In Example 7, the device of Example 4 includes, wherein the plurality of different stacked conductive materials includes three conductive materials including one of titanium, tantalum, and molybdenum stacked on one of copper or gold that is stacked on one of titanium, tantalum, and molybdenum.

In Example 8, the device of Example 4 includes, wherein the plurality of different stacked conductive materials includes two conductive materials including one of gold, platinum, and molybdenum stacked on copper.

In Example 9, the device of Example 4 includes, wherein the plurality of different stacked conductive materials includes three conductive materials including one of gold, platinum, and molybdenum stacked on one of copper or gold that is stacked on one of titanium, tantalum, and molybdenum.

In Example 10 a method can include drilling one or more via holes in a polyimide buildup layer, depositing a first conductive material on the polyimide buildup layer and lining the one or more via holes using an electroless plating process, and laser spallating a portion of the first conductive material on the polyimide buildup layer so as to pattern the first conductive material into traces on the polyimide buildup layer.

In Example 11, the method of Example 10 includes depositing a second conductive material on at least a portion of the first material conductive material before laser spallating a portion of the first conductive material and wherein laser spallating a portion of the first conductive material includes laser spallating a portion of both the first and second conductive materials simultaneously.

In Example 12, the method of Example 11 includes depositing a third conductive material on at least a portion of the second material conductive material before laser spallating a portion of the first and second conductive materials and wherein laser spallating a portion of the first and second conductive materials includes laser spallating a portion of both the first, second, and third conductive materials simultaneously.

In Example 13, the method of Example 10 includes, wherein the first conductive material is copper and the copper is deposited on the polyimide buildup layer to between about 0.5 micrometers and about 2 micrometers thick.

In Example 13, the method of Example 10 includes at least partially filling the one or more via holes with conductive material using an electrolytic plating process prior to laser spallating the first conductive material.

In Example 14, the method of Example 10 includes at least partially filling the one or more via holes with conductive material using an electroless plating process prior to laser spallating the first conductive material.

In Example 15, a method can include depositing a first conductive material on a first surface of a polyimide buildup layer, depositing a polyethylene terephthalate (PET) material on the first conductive material, depositing a second conductive material on a second surface of the polyimide buildup layer, the second surface opposite the first surface, drilling one or more via holes through the PET material, the first conductive material and the polyimide material to the second conductive material, and laser spallating a portion of the first conductive material and the second conductive so as to pattern the first conductive material into traces on the polyimide buildup layer.

In Example 17, the method of Example 16 includes depositing a third conductive material different from the first conductive material on the first conductive material prior to laser spallating the portion of the first conductive material, and wherein laser spallating the portion of the first conductive material includes laser spallating a corresponding portion of the third conductive material simultaneously.

In Example 18, the method of Example 17 includes depositing a fourth conductive material different from the third conductive material on the third conductive material prior to laser spallating the portion of the first conductive material, and wherein laser spallating the portion of the first conductive material includes laser spallating a corresponding portion of the fourth conductive material simultaneously.

In Example 19, the method of Example 17 includes depositing a fifth conductive material different from the second conductive material on the second conductive material prior to laser spallating the portion of the second conductive material, and wherein laser spallating the portion of the second conductive material includes laser spallating a corresponding portion of the fifth conductive material simultaneously.

In Example 20, the method of Example 19 includes depositing a sixth conductive material different from the fifth conductive material on the fifth conductive material prior to laser spallating the portion of the second conductive material, and wherein laser spallating the portion of the second conductive material includes laser spallating a corresponding portion of the sixth conductive material simultaneously.

The above description of embodiments includes references to the accompanying drawings, which form a part of the description of embodiments. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device comprising:
   a flexible polyimide material;
   a first plurality of traces on a first surface of the flexible polyimide material, wherein the first plurality of traces are patterned on the flexible polyimide material using laser spallation; and
   a second plurality of traces on a second surface of the flexible polyimide material, the second surface of the flexible polyimide material opposite the first surface of the flexible polyimide material, wherein the second plurality of traces are patterned on the flexible polyimide material using laser spallation such that the second plurality of traces include sidewalls that are more perpendicular to the second surface of the flexible polyimide material when the flexible polyimide material is in an unstressed position than traces created using a semi-additive process and traces created using a subtractive process.

2. The device of claim 1, wherein the second plurality of traces include copper traces that are between about 0.5 micrometers and 2 micrometers thick.

3. The device of claim 1, wherein the second plurality of traces include a plurality of different stacked conductive materials including two or more of gold, silver, titanium, tantalum, molybdenum, copper, aluminum, and platinum.

4. The device of claim 3, wherein the plurality of different stacked conductive materials includes two conductive materials including one of silver, gold, and platinum stacked on one of copper and gold.

5. The device of claim 3, wherein the plurality of different stacked conductive materials includes two conductive materials including one of copper and gold stacked on one of titanium, tantalum, and molybdenum.

6. The device of claim 3, wherein the plurality of different stacked conductive materials includes three conductive materials including one of titanium, tantalum, and molybdenum stacked on one of copper or gold that is stacked on one of titanium, tantalum, and molybdenum.

7. The device of claim 3, wherein the plurality of different stacked conductive materials includes two conductive materials including one of gold, platinum, and molybdenum stacked on copper.

8. The device of claim 3, wherein the plurality of different stacked conductive materials includes three conductive materials including one of gold, platinum, and molybdenum stacked on one of copper or gold that is stacked on one of titanium, tantalum, and molybdenum.

9. A method comprising:
   drilling one or more via holes in a polyimide buildup layer;
   depositing a first conductive material on a first surface of the polyimide buildup layer and lining the one or more via holes using an electroless plating process;
   laser spallating a portion of the first conductive material on the polyimide buildup layer so as to pattern the first conductive material into a first plurality of traces on the polyimide buildup layer; and
   depositing a second plurality of traces on a second surface of the polyimide buildup layer, the second surface of the polyimide buildup layer opposite the first surface of the polyimide buildup layer, wherein the second plurality of traces are patterned on the polyimide buildup layer using laser spallation such that the second plurality of traces include sidewalls that are more perpendicular to the second surface of the polyimide buildup layer when the polyimide material is in an unstressed position than traces created using a semi-additive process and traces created using a subtractive process.

10. The method of claim 9 wherein the second conductive material is further deposited on at least a portion of the first material conductive material before laser spallating a portion of the first conductive material and wherein laser spallating a portion of the first conductive material includes laser spallating a portion of both the first and second conductive materials simultaneously.

11. The method of claim 10 further comprising depositing a third conductive material on at least a portion of the second conductive material before laser spallating a portion of the first and second conductive materials and wherein laser spallating a portion of the first and second conductive materials includes laser spallating a portion of both the first, second, and third conductive materials simultaneously.

12. The method of claim 9, wherein the first conductive material is copper and the copper is deposited on the polyimide buildup layer to between about 0.5 micrometers and about 2 micrometers thick.

13. The method of claim 9 further comprising at least partially filling the one or more via holes with conductive material using an electrolytic plating process prior to laser spallating the first conductive material.

14. The method of claim 9 further comprising at least partially filling the one or more via holes with conductive material using an electroless plating process prior to laser spallating the first conductive material.

15. A method comprising:
    depositing a first conductive material on a first surface of a polyimide buildup layer;
    depositing a polyethylene terephthalate (PET) material on the first conductive material;
    depositing a second conductive material on a second surface of the polyimide buildup layer, the second surface opposite the first surface;
    drilling one or more via holes through the PET material, the first conductive material and the polyimide buildup layer to the second conductive material; and
    laser spallating a portion of the first conductive material and the second conductive material so as to pattern the first conductive material into traces on the polyimide buildup layer.

16. The method of claim 15 further comprising:
    depositing a third conductive material different from the first conductive material on the first conductive material prior to laser spallating the portion of the first conductive material; and
    wherein laser spallating the portion of the first conductive material includes laser spallating a corresponding portion of the third conductive material simultaneously.

17. The method of claim 16 further comprising:
    depositing a fourth conductive material different from the third conductive material on the third conductive material prior to laser spallating the portion of the first conductive material; and wherein laser spallating the portion of the first conductive material includes laser spallating a corresponding portion of the fourth conductive material simultaneously.

18. The method of claim 16 further comprising:

depositing a fifth conductive material different from the second conductive material on the second conductive material prior to laser spallating the portion of the second conductive material; and wherein laser spallating the portion of the second conductive material includes as spallating a corresponding portion of the fifth conductive material simultaneously.

19. The method of claim 18 further comprising:

depositing a sixth conductive material different from the fifth conductive material on the fifth conductive material prior to laser spallating the portion of the second conductive material; and wherein laser spallating the portion of the second conductive material includes laser spallating a corresponding portion of the sixth conductive material simultaneously.

* * * * *

UNITED STATES PATENT AND TRADEMARK OFFICE
CERTIFICATE OF CORRECTION

PATENT NO. : 10,672,701 B2
APPLICATION NO. : 15/762548
DATED : June 2, 2020
INVENTOR(S) : Raghunathan et al.

Page 1 of 1

It is certified that error appears in the above-identified patent and that said Letters Patent is hereby corrected as shown below:

In the Claims

In Column 15, Line 10, in Claim 18, delete "as" and insert --laser-- therefor

Signed and Sealed this
Eighteenth Day of January, 2022

Drew Hirshfeld
*Performing the Functions and Duties of the*
*Under Secretary of Commerce for Intellectual Property and*
*Director of the United States Patent and Trademark Office*